United States Patent
Manzer (12) United States Patent (10) Patent No.: US 7,882,890 B2
Manzer (45) Date of Patent: Feb. 8, 2011

(54) THERMALLY PUMPED LIQUID/GAS HEAT EXCHANGER FOR COOLING HEAT-GENERATING DEVICES

(75) Inventor: Dennis G Manzer, Bedford Hills, NY (US)

(73) Assignee: International Business Machines Corporation, Armonk, NY (US)

( * ) Notice: Subject to any disclaimer, the term of this patent is extended or adjusted under 35 U.S.C. 154(b) by 774 days.

(21) Appl. No.: 11/777,837

(22) Filed: Jul. 13, 2007

(65) Prior Publication Data
US 2009/0014155 A1 Jan. 15, 2009

(51) Int. Cl.
*F28D 15/02* (2006.01)
(52) U.S. Cl. .............................. 165/104.24; 165/104.33
(58) Field of Classification Search ............ 165/104.24, 165/104.27, 104.33
See application file for complete search history.

(56) References Cited

U.S. PATENT DOCUMENTS 3,285,001 A * 11/1966 Turnblade .................... 60/531
3,898,017 A * 8/1975 Mandroian .................... 417/65
5,117,901 A * 6/1992 Cullimore .............. 165/104.27
2006/0185826 A1* 8/2006 Ohashi .................. 165/104.24

OTHER PUBLICATIONS

Incroppera and Dewitt, "Heat and Mass Transport," Textbook, Wiley Press 2002, p. 612.

* cited by examiner

*Primary Examiner*—Teresa J Walberg
(74) *Attorney, Agent, or Firm*—Michael J. Buchenhorner; Vazken Alexanian (57) ABSTRACT

A cooling system for a heat-generating device includes: coolant fluid; an evaporator for holding the coolant fluid and for heating the coolant fluid; said evaporator in close proximity to the heat-generating device for removing unwanted heat. The cooling system also includes a plurality of tubes for providing a flow path for the coolant fluid and gases produced by the evaporator; a heat exchanger through which the tubes pass for cooling the coolant fluid. The heat exchanger includes: a reservoir, a coolant, and a heating element for heating the gas so that it expands and pushes cool coolant fluid back to the evaporator. The heating element may be located inside the reservoir.

20 Claims, 8 Drawing Sheets

THERMALLY PUMPED LIQUID/GAS HEAT EXCHANGER FOR COOLING HEAT-GENERATING DEVICES

CROSS-REFERENCE TO RELATED APPLICATIONS

Not applicable.

STATEMENT REGARDING FEDERALLY SPONSORED-RESEARCH OR DEVELOPMENT

Not applicable.

INCORPORATION BY REFERENCE OF MATERIAL SUBMITTED ON A COMPACT DISC

Not Applicable.

FIELD OF THE INVENTION

The invention disclosed broadly relates to the field of cooling devices for microelectronics and more specifically relates to passive cooling heat sinks.

BACKGROUND OF THE INVENTION

Electronic chips such as microprocessor chips generate much heat. As processing power goes up, the chips produce more heat which could damage the electronic circuits in the chip; therefore it is important to cool the chips. Many cooling methods have been developed for directly cooling hot chips, heat sinks being one such method. Generally, heat sinks fall into two categories: active heat sinks and passive heat sinks. Active heat sinks cool a chip using a fan or other active devices to move heat away from the chip. Passive heat sinks perform the cooling function without a fan, instead relying on ambient conditions provided by design to cool the chip.

Active heat sinks, because they employ a fan or other mechanism, require that some energy be expended in order to cool the chip. Additionally, the introduction of a moving part (the fan) to the cooling device increases the possible failure mechanisms. Some passive heat sinks address these problems by using a cooling fluid to cool the hot chips rather than a fan. The use of fluid is not without its problems. In one of the latest developments in passive heat sink technology, the Heatlane™ heat pipe device (Heatlane is a trademark of TS Heatronics Co., Ltd.) relies on an unstable, oscillatory exchange of fluid and gas back and forth within the evaporation section of the device. This is problematic because hot fluid and gas might return into the evaporation section. Also, with the Heatlane™, energy needs to be expended to cool the chip by way of a fan blowing air through the air heat exchanger. Heat pipes use a wick to return the fluid to the evaporation section. This technology has reached its limits in modern systems—multiple heat pipes need to be used on single chips because not enough coolant is available in a single pipe.

Therefore, there is a need for a better passive cooling method and apparatus for chips that generate more heat.

SUMMARY OF THE INVENTION

Briefly, according to an embodiment of the invention, a cooling system for a heat-generating device includes: coolant fluid; an evaporator for holding the coolant fluid and for heating the coolant fluid; said evaporator in close proximity to the heat-generating device for removing unwanted heat. The cooling system also includes a plurality of tubes for providing a flow path for the coolant fluid and gases produced by the evaporator; a heat exchanger through which the tubes pass for cooling the coolant fluid and gas. The heat exchanger includes: a reservoir, a coolant, and a heating element for heating the gas so that it expands and pushes coolant fluid back to the evaporator. The heating element may be located inside the reservoir.

Additionally, the cooling system according to an embodiment of the invention may include check valves, gas traps, and a coolant return tube. The cooling system may also include a baffle disposed within the evaporator far from the tubes.

A method according to an embodiment of the invention provides the steps of: heating coolant fluid contained in an evaporator in close proximity to the device; evaporating the coolant fluid to release gases used to pump hot coolant fluid and gases out of the evaporator and into the heat exchanger; transferring heat from the coolant fluid and gases to the heat exchanger in one or more tubes; collecting condensed coolant fluid and cooled gas in the reservoir of the heat exchanger; heating the cooled gas and fluid with the heating element; and returning the condensed coolant fluid back to the evaporator using the generated heated gas.

BRIEF DESCRIPTION OF THE DRAWINGS

To describe the foregoing and other exemplary purposes, aspects, and advantages, the following detailed description of an exemplary embodiment of the invention with reference to the drawings, in which.

DETAILED DESCRIPTION

We describe a cooling system for heat-generating devices, such as electronic chips. In particular, a two-phase system in which a coolant is boiled offers an attractive method of moving large amounts of heat away from a hot chip. This provides a novel method of guaranteeing the circulation of the coolant, assuring that the evaporator never boils dry. This is in contrast to heat pipes, which use a wick to return the fluid to the evaporation section.

Figure 8:
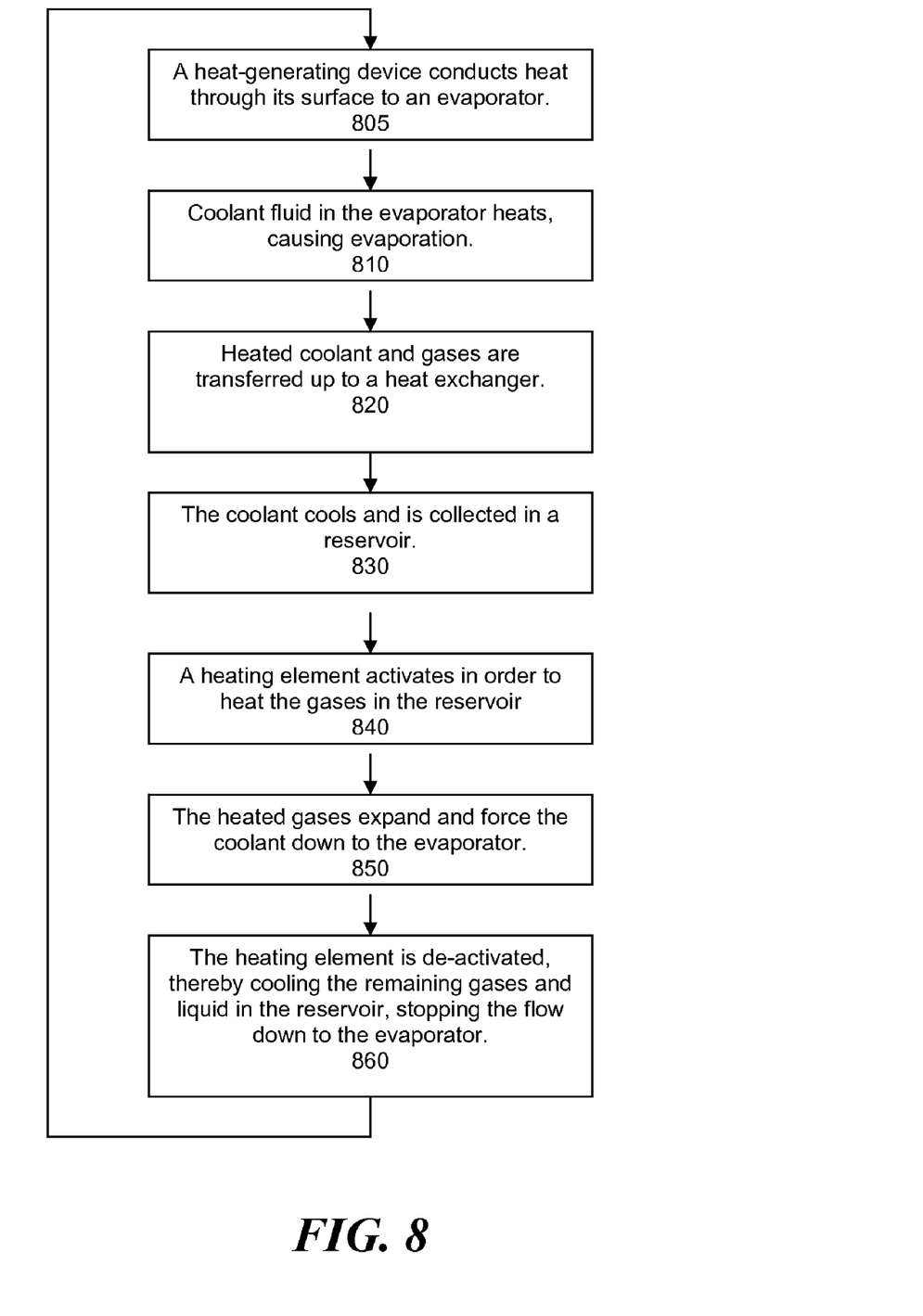
FIG. 8 is a flowchart representing the steps for carrying out the cooling method according to an embodiment of the present invention.

Referring to FIG. 8, the process begins at step 805 when a heat-generating device conducts heat through its surface or an interface material to an evaporator filled with a liquid coolant fluid. This direct heating of the coolant in the evaporator causes vaporization of the coolant in the evaporator in step 810, absorbing heat through the heat of vaporization of the coolant. The hot coolant gases and entrained fluid are rapidly pumped out of the evaporator into a heat exchanger in step 820. The "pump" effect occurs because the vaporized gas acts as a pump, forcing the hot gas and entrained fluid up through the heat exchanger. The vaporized coolant and hot liquid is forced under pressure to bubble through the coolant in the heat exchanger, transferring its heat to the coolant and to the metal tubes of the heat exchanger. In step 830, the coolant is cooled, and once cooled, the chilled, condensed coolant and cool gas are collected in a reservoir.

Next, in step 840, when either the coolant level is too low in the evaporator, or the coolant temperature is too high, a heating element is activated in the condensed coolant and gas in the reservoir. This causes gases in the heat exchanger to be generated, heated, and expanded in step 850. The expanding gases push the condensed coolant which is very rapidly re-injected into the evaporator through a tube. An external sensor can be used to determine when the temperature is too high. This injection of coolant requires very little energy, or heat, added to the system. It returns condensed fluid to where it is needed, right to the surface interface of the heat-generating device, such as a chip. In step 860, the heating element is quickly deactivated, and the cycle repeats with the hot, gaseous coolant and entrained hot fluid pumped out of the evaporator to the heat exchanger.

Figure 1:
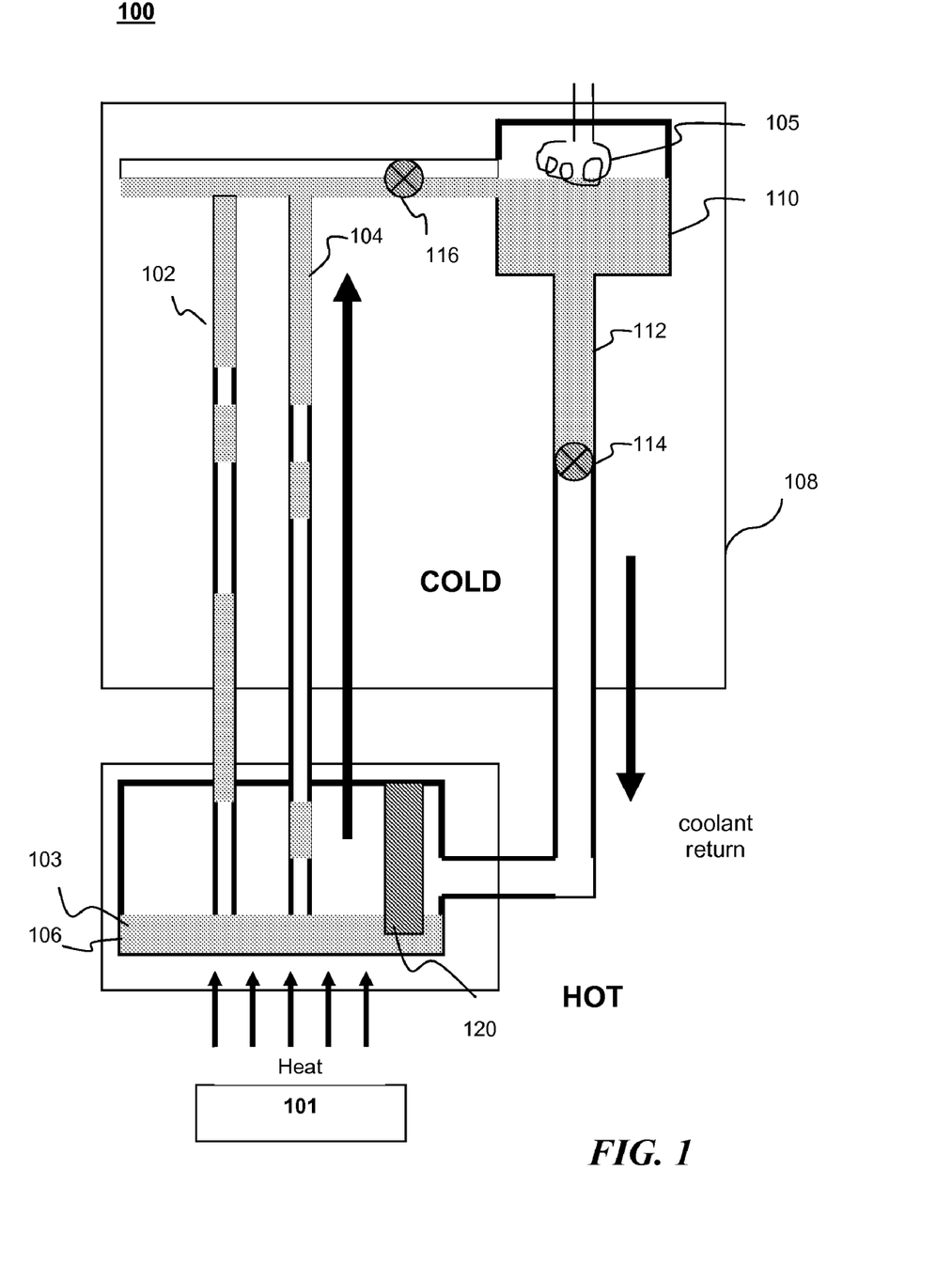
FIG. 1 shows a cooling system with its heating system in the up cycle, according to an embodiment of the invention.

We now describe in more detail the operation of the cooling system in the "Up" cycle wherein the coolant flows up to the heat exchanger. FIG. 1 shows a cooling system 100 according to an embodiment of the invention. The cycle begins with the system 100 in a quasi-equilibrium state with a coolant 103 vaporizing in the evaporator 106 and gas being pushed through the coolant 103 trapped in the heat exchanger pipes 102, 104. The heating element 105 is off at this point.

The evaporator 106 is positioned in good thermal contact with (in close proximity to) a chip 101 or other heat-generating device. The evaporator 106 may be a chamber with metal heat conductors running through it, or it might be fine metal tubes as in a steam generator. The evaporator 106 should be optimized to boil as much coolant as possible as quickly as possible. Special coatings and structures can be designed, optimized for the coolant, which is understood in the literature of boiling. The evaporator surface might be flat with a special coating, or be further optimized with a finned or pin structure for more surface area within the boiler.

As the chip 101 heats up, unwanted heat emanating from the chip 101 heats a liquid coolant 103 in the evaporator 106. The coolant or cooling fluid 103 is preferably chosen to have a high heat of vaporization and a low boiling point. The coolant should also have a high vapor pressure to make the pumping feature work well. And it should boil at a temperature low enough to cool the chip. Examples of the coolant 103 may be one of the following: 1) water at a pressure lower than one atmosphere—although water has a very low vapor pressure and may not work well; 2) butane; 3) any commercial refrigerant; 4) methyl chloride; 5) ammonia at eight (8) bar of pressure; 6) ammonia-hydrogen mix (used in refrigeration); 7) 3M's HFE-7000, with a boiling point of 34 degrees Celsius; 8) Methanol at 100 mm Hg pressure, boiling at room temperature; or 9) liquid carbon dioxide. It should be noted that other fluids with good vapor pressure, low boiling point, and good environmental properties can and may be used in an embodiment of the invention.

As the liquid coolant 103 heats, some of it vaporizes. For example, methanol at a pressure of 100 mm Hg boils immediately at room temperature and builds pressure rapidly. HFE-7000 boils at about 34 degrees Celsius at one atmosphere, cool enough to cool a heated chip 101. HFE-7000 is not flammable, is not a green house gas, and is non-toxic; therefore, it is well suited for use in this application. The lower density of the heated gases and the pressure exerted by the gases cause it to rise up and additionally entrain some fluid 103 into the heat exchanger 108. The vaporized gas acts as a pump, forcing the hot gas and the entrained fluid 103 up through the heat exchanger pipes 102 and 104. Both gas and fluid are simultaneously transferred to the heat exchanger 108 in this way.

By moving both hot gas and fluid 103, large amounts of heat may be transferred more efficiently than by using fluid alone. As the hot gas forces its way through the fluid 103, bubbling up through the coolant 103 in the heat exchanger pipes 102 and 104, some fluid is necessarily moved up toward a reservoir in the heat exchanger 108. This is similar to a coffee percolator with hot gas bubbling through columns of fluid. The pumping of the gas will occur as it moves from the high pressure of the evaporator 106 to the lower pressure in the exchanger 108. The optimal fill ratio (how much liquid coolant vs. gas) depends upon the system and can be determined by experimentation. Both the pressure differential and the coffee percolator-like "bubble pump" mechanism driven by gravity push hot coolant into the heat exchanger 108.

Rather than two tubes (pipes), however, just one tube could be used. In the alternative, a dozen or more tubes could be employed. The tubes 102 and 104 in the example of FIG. 1 are preferably thin-walled and of a small diameter, approximately one-eighth of one inch to three-eighths of an inch (⅛" to ⅜") in order to conduct heat efficiently.

The hot fluid and gas 103 is directed up to the cooler areas of the heat exchanger 108 where it is cooled and condensed Then some of the cooled, condensed fluid 103 collects in the heat exchanger reservoir 110. The reservoir 110 is a cool chamber or collection of tubes, preferably metal tubes. The chamber 110 remains cool because it is disposed within or in proximity to the heat exchanger 110, or radiator. Unlike the Heatlane™, the system 100 allows hot bubbles or slugs of gas to be forced through the coolant 103 in the heat exchanger 108. This hot gas is forced under pressure toward the reservoir 110, where it can cool and condense on its way by transferring its heat either to the coolant 103 or directly to the tube's walls in the exchanger 110.

The cooling system 100 requires only one active element—a heating element, wire, or cartridge heater, 105, used intermittently to return the cooled, condensed fluid 103 back to the evaporator 106. The fluid 103 can be returned through a third tube 112. The third tube 112 is a return tube, returning the cooled liquid 103 to the evaporator 106. If the return tube 112 is long enough and high enough, gravity alone would ensure that cold fluid 103 would return to the evaporator 106. However, in this embodiment we focus on a design for microprocessors, necessitating a small size. Heating the cooled gas or boiling some coolant causes the gas to expand, thereby moving (injecting) the coolant 103 back to the evaporator 106. This requires very little energy—a small fraction of the total energy being given off by the chip 101. Heating the gas quickly in the reservoir 110 does not heat the coolant liquid (anywhere) appreciably. The gas is generated and heated just enough to move the liquid 103 through the return tube 112.

Figure 7:
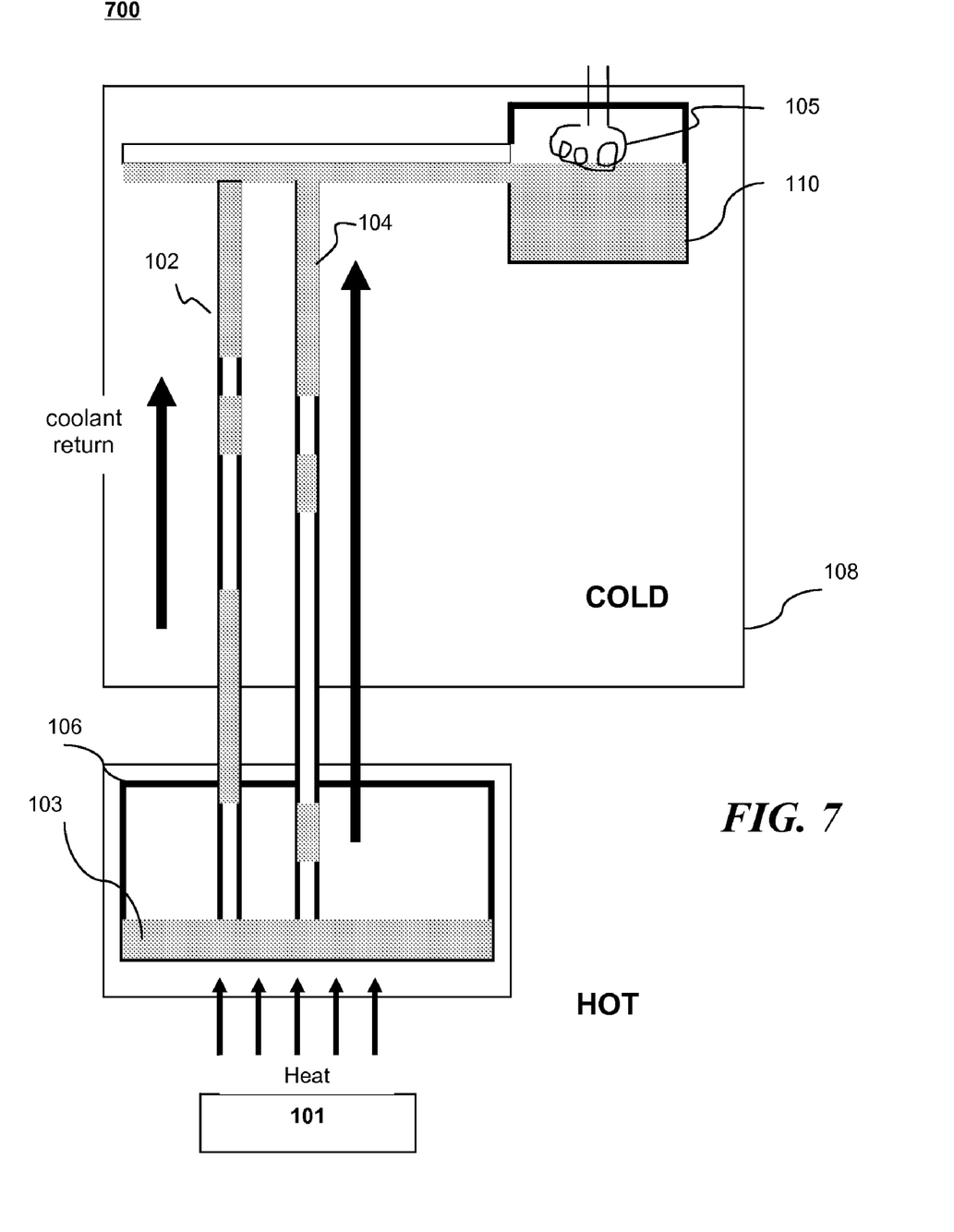
FIG. 7 shows the cooling system of FIG. 1 without the check valves and third tube, according to another embodiment of the present invention.

In this embodiment we may have two passively moving parts, the opening and closing of the check valves 114 and 116 which restrict the flow of liquid. In this example the check valves are of the ball-type. The passive check valves 114 and 116 may be of the ball variety shown, but any type will work. The check valves 114, 116 improve the efficiency of the device, but the system 100 works without them if the return tube 112 is closed off. This type of valve is passive, analogous to the valves which operate in a heart. An active valve could be used but it would be costly, more subject to failure, and would require a control mechanism. Note that these are an optimization to the system 100 but are not required. The system 100 as presented operates without any moving parts or valves as shown in FIG. 7. Check valves are required only for an embodiment employing a return tube. For example, the prototype in FIG. 4 has no valves.

The Heatlane™ device mentioned earlier relies on an unstable, oscillatory exchange of fluid and gas back and forth with the evaporation section of the device. The system 100 is designed so that there is a unidirectional flow of heat from the evaporator 106 to the heat exchanger 108. The system 100 cools by boiling a liquid which boils at a low temperature. The hot gas generated is uniformly pushed through the heat exchanger to be cooled and condensed.

Therefore, unlike the Heatlane™ device, the system 100 uses a nearly unidirectional flow of hot gas and fluid to the colder section of the system 100. This system 100 does not require gravity to operate, only that the entrances and exits of the reservoirs be placed to make sense with respect to gravity. In fact the one-way check valves 114 and 116 are not required. They are placed in the device for improved efficiency. Refer to FIG. 7 where a system 700 is shown without the valves 114, 116, and without the third tube. Without the third tube 112 and check valves 114, 116, coolant could be blown back through the heat exchanger 108, warming up the coldest fluid, and returning much of the liquid coolant 103 back to the evaporator 106. This would result in an average warmer coolant 103 temperature in the evaporator 106 compared with the embodiment previously discussed, but it would still provide cooling. (An embodiment without the third tube 112 and check valves 114, 116 has been demonstrated and measured with methanol and HFE-7000 as examples.) See FIG. 4 for an illustration of a coolant system with only one tube.

Figure 2:
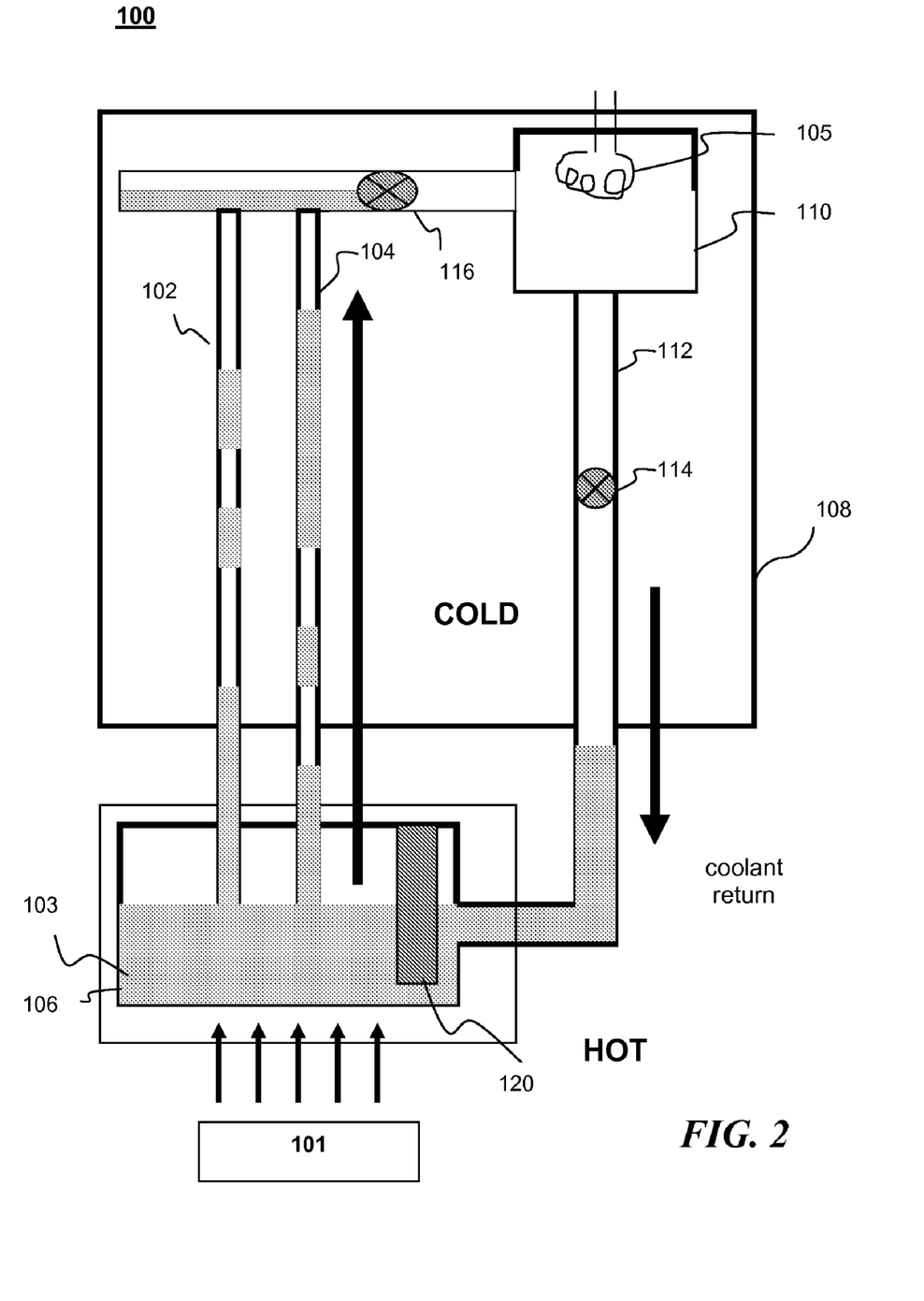
FIG. 2 shows the cooling system with its heating system in the down cycle, according to an embodiment of the invention.

This system 100 uses a heater 105 to drive the cycle. The heater 105 can be a coil of tungsten or titanium heating wire, but more likely is a heater cartridge having sufficient surface area and a proper coating to heat a volume of fluid quickly, and is used intermittently in a pulsed fashion to return the cooled, condensed fluid 103 back to the evaporator 106. The heater 105 can also double as a heat sensor with a built-in thermocouple or fluid detector if a closed loop control is implemented. Alternatively, the heater 105 can be activated periodically, without regard to the status of cooling, or it can be activated by some other external sensor or trigger event. Some examples are: the fluid level in the evaporator falling below a minimum threshold or a temperature sensor reaching a maximum threshold temperature. There are other simple methods for activating the heater 105. One option is if the chip is a microprocessor, its temperature sensors can detect that the boiler is going dry and request more coolant 103—just as it requests that the fan controllers spin faster today in personal computers The "Down" cycle of the system 100 is shown in FIG. 2 wherein cooled, condensed coolant 103 is returned to the evaporator 106. The heating element 105 is turned on (or is in its intermittent "on" phase). This generates heat which causes the gas to expand and "push" the cooled coolant 103 back to the evaporator 106. The coolant 103 rapidly flows down the return tube 112 to fill the evaporator 106 again. Immediately, the hot fluid 103 in the evaporator 106 may be pumped to the heat exchanger 110. Moving hot fluid out of the evaporator enhances the cooling power of evaporation alone. With the return of cool fluid to the evaporator, the total system pressure drops, and coolant 103 begins boiling in the evaporator 106 immediately. It is not intended that the heater 105 do anything other than generate hot gas to force the coolant to return to the evaporator 106. The check valve 116 is automatically in the closed position, prohibiting the flow of the coolant 103 out of the radiator 104 back into the evaporator 106.

Figure 3:
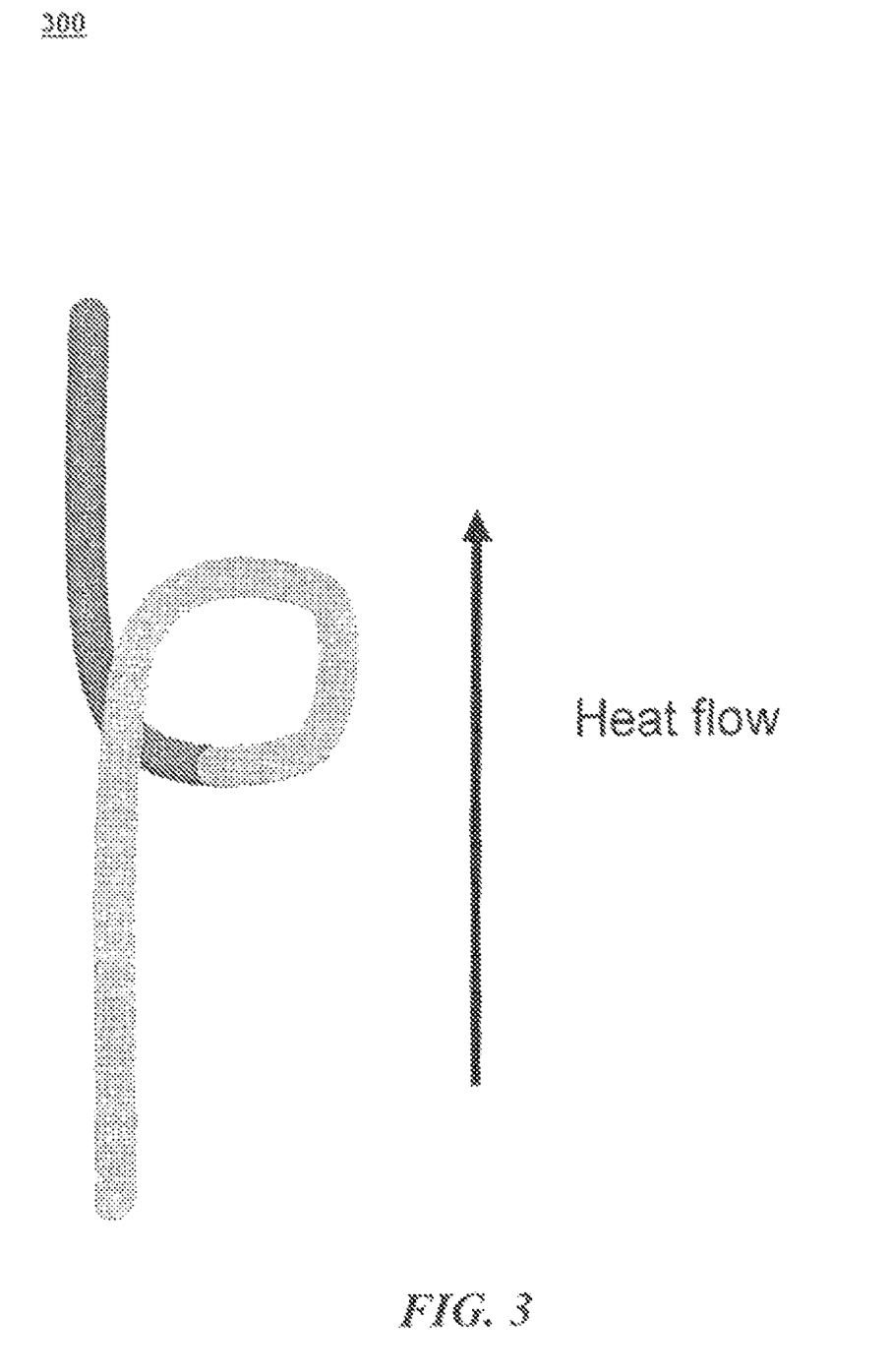
FIG. 3 shows a gas trap according to an embodiment of the invention.

Referring now to FIG. 3 there is shown an illustration of a gas trap 300 that can be used with the system 100. The gas trap 300 helps stand coolant up in the exchanger tubing, especially if wide diameter tubing is used. The gas trap 300 keeps fluid from flowing back by gravity. It is useful if the tubes are of a large diameter, but it is generally not necessary. Gas pressure will hold the column of fluid up if provided with a trap. Without the trap 300, gas might fill the tube enough to allow the free fall of fluid back, which is undesirable. Each Up tube 102, 104 might have a trap, or all up tubes can be fed from a single large pipe with a trap.

Figure 4:
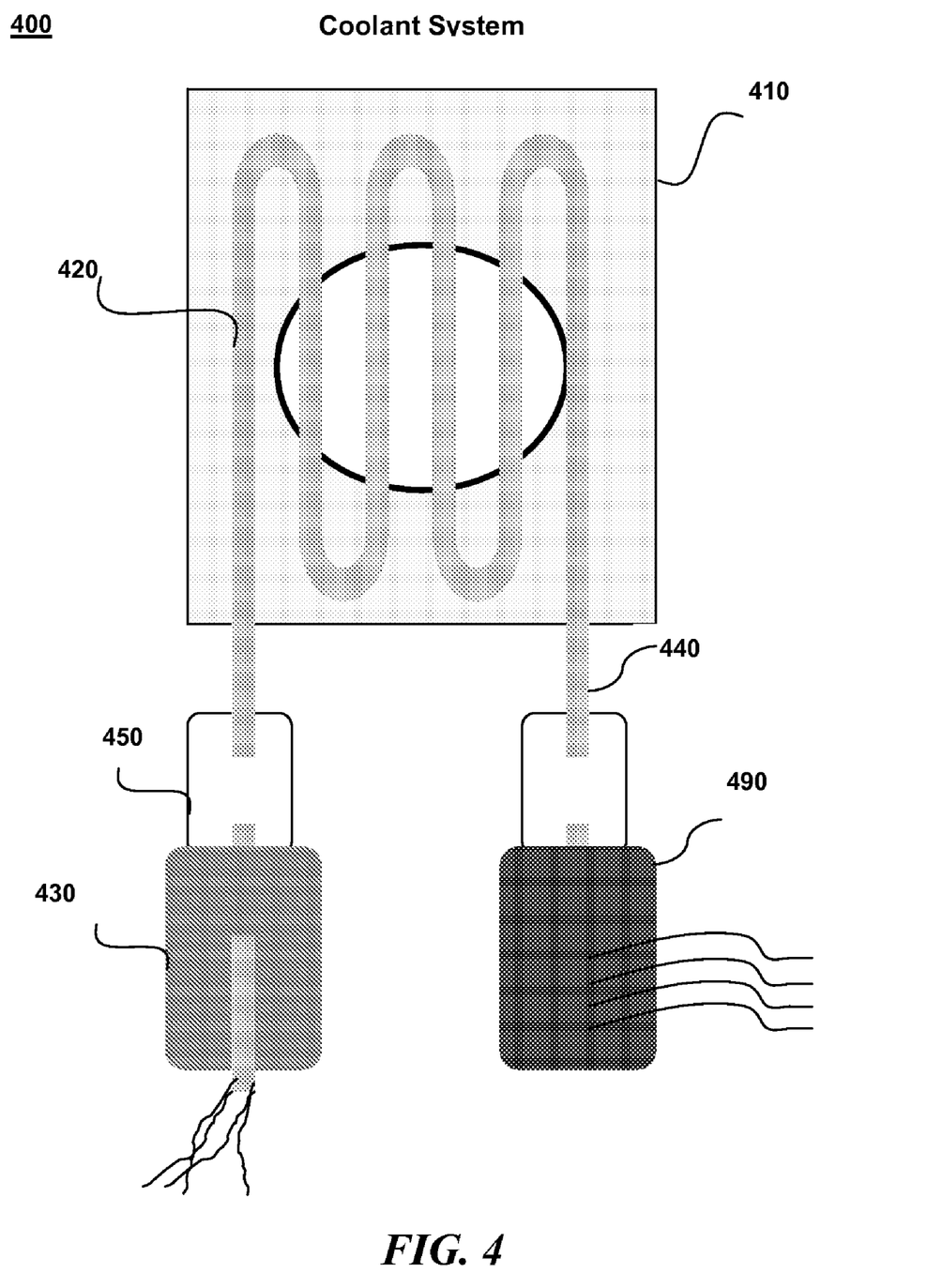
FIG. 4 shows a cooling system using only one tube, according to an embodiment of the invention.

Referring to FIG. 4 there is shown a coolant system 400 using only one tube 440, according to another embodiment of the present invention. The tube 440 is approximately ⅜" in diameter and is disposed inside of a Lytron™ heat exchanger 410 and filled with approximately 0.5 L of liquid methanol 420. Each end of the tube 440 is inserted into boro-silica view tubes 450 of a thicker diameter than the tubing 440. Each of the two boro-silica tubes 450 are attached to a chamber containing a three-inch long, ⅜ inch diameter stainless heater cartridge 430. In this demonstration, one heater cartridge simulates the heat of a chip and is run continuously at a few hundred watts of power. The other is pulsed periodically and acts as the return pump.

Figure 5:
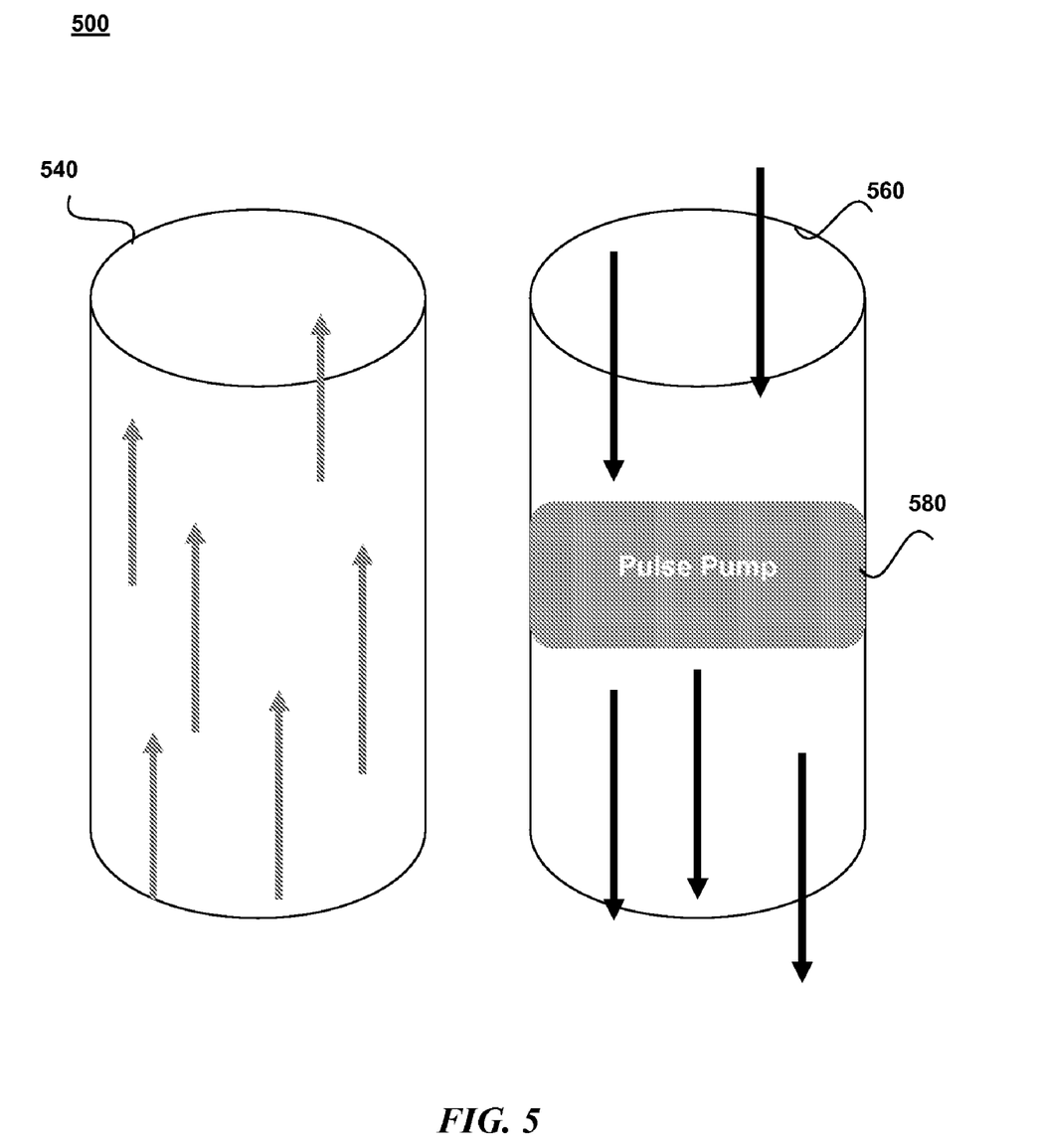
FIG. 5 shows a dual tube design according to an embodiment of the invention.
Figure 6:
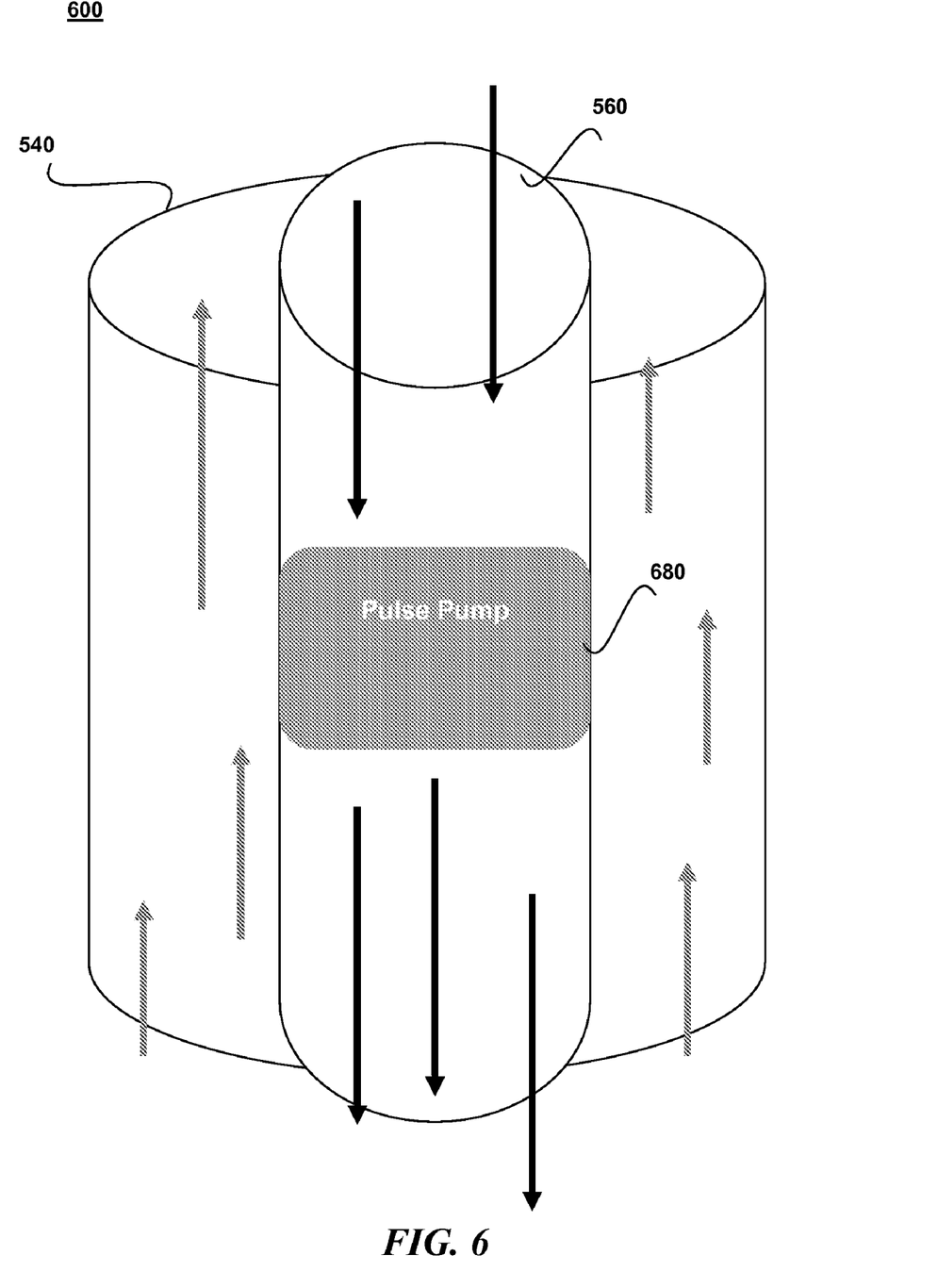
FIG. 6 shows a coaxial return pump design, according to an embodiment of the invention.

FIG. 5 is a cross-section image of two tubes in a dual tube design 500. One tube 540 conducts the heated liquid and gas to the exchanger 108 while the other tube 560 (the return tube) returns the cooled liquid and gas to the evaporator 106. The pulse pump action is the same as described earlier; a heating element in a reservoir, with check valves fore and aft. FIG. 6 shows co-axial tubing according to another embodiment of the present invention. The tubing of FIG. 6 has the external appearance of a single tube, but is co-axial as shown. This co-axial tubing implementation may be used in an embodiment such as that shown in FIG. 1 with the exception being the return tube is co-axial with the "up" tube. This co-axial system may be easier to deploy.

Referring to FIG. 4, most of the heat is dissipated in the first tube 420 running up into the heat exchanger, especially inside the exchanger 410. Heat dissipation drops off rapidly in a dry tube as described in "Heat and Mass Transport," Incroppera and DeWitt Textbook, Wiley, 2002, p 612. Looking at FIG. 4, it is best that much of the tubing contain liquid coolant, especially in the left-most tube 420 leading up from the evaporator 106. The heat transfer is best if bubbles of hot gas rise through the liquid coolant 103. Heat transfer and dissipation drop off rapidly if the tube becomes dry, containing only gas. In a prototype example as in FIG. 4, at less than 150 watts, gravity alone does most of the work and the pump 490 does almost no pumping. At greater than 200 watts, vigorous entrainment of the coolant 103 with rising gas slugs spills and condenses into the return pump reservoir 490. At greater than 300 watts the system is close to Critical Heat Flux (CHF) and becomes difficult to operate. This system works by "pool boiling," just as in a tea kettle. The CHF is the point beyond which pool boiling fails to occur, and the chip heat becomes insulated by a layer of gas. A simple example of CHF is that if you turned the heat up high enough under a tea kettle, the bottom will melt out, even though there is liquid in the kettle. The layer of steam between the bottom of the kettle and the water inside insulates the heat source and pool boiling stops.

In this methanol test, the pressure will never exceed one atmosphere and will usually remain well below one atmosphere. Within the parameters of the test, the CHF was some-where around 300 Watts, and cooling was not sustainable. Known methods of improving the boiler could easily raise this maximum flux.

A preferred pump system is shown in FIG. 6. A coaxial return pump design 600 shows a pulse pump 680 disposed within the return tube 560. The return tube 560 is placed inside the "up" tube 540. The pulse pump 680 is identical to the heating element pump previously described, situated to return coolant from the reservoir in the radiator back to the evaporator. The pump 680, like the pump in FIG. 5, is placed where the condensed coolant 103 is within the return tube 560. This coaxial implementation may be simpler and more efficient than the system of FIG. 5 and the one-tube system of FIG. 4.

Therefore, while there have been described what are presently considered to be the preferred embodiments, it will understood by those skilled in the art that other modifications can be made within the spirit of the invention.

We claim:

1. A cooling system for a heat-generating device, the system comprising:
    a coolant;
    an evaporator comprising a single chamber for both containing and heating the coolant;
        wherein the single chamber contains both the coolant to be heated and gases produced by heating the coolant
        wherein said evaporator is in close proximity to a surface of the heat-generating device for removing unwanted heat generated by said heat-generating device;
    a plurality of tubes for providing a flow path for the coolant and gases produced by the evaporator; each tube having a first end connected to the evaporator; and
    a heat exchanger through which the plurality of tubes pass for cooling the coolant, the heat exchanger comprising:
        a reservoir within the heat exchanger, connected to a second end of each of the plurality of tubes;
        a coolant within the reservoir; and
        a heating element within said heat exchanger for heating the coolant in the reservoir, wherein the heat causes the coolant gases to expand and force coolant back to the evaporator for cooling the surface of the heat-generating device.

2. The cooling system of claim 1 wherein the heating element is disposed inside the reservoir.

3. The cooling system of claim 1 further comprising a plurality of one-way check valves in the heat exchanger for restricting the flow of coolant.

4. The cooling system of claim 1 further comprising a gas trap in the at least one of the plurality of tubes.

5. The cooling system of claim 1 wherein the surface of the single chamber is designed with microstructures to enhance pool boiling of the coolant.

6. The cooling system of claim 1 further comprising a coolant return tube, having a first end connected to the heat exchanger reservoir and a second end connected to the evaporator.

7. The cooling system of claim 6 further comprising a plurality of one-way check valves in the coolant return tube for restricting a flow of coolant from the heat exchanger to the evaporator.

8. The cooling system of claim 1 wherein the single chamber has metal heat conductors running through said single chamber.

9. The cooling system of claim 1 wherein the plurality of tubes are metal tubes.

10. The cooling system of claim 1 wherein the coolant may be selected from any one of a group consisting of: water at a pressure lower than one atmosphere; butane; any commercial refrigerant such as chlorofluorocarbons; methyl chloride; ammonia at eight bars of pressure; an ammonia-hydrogen mix; and liquid carbon dioxide.

11. The cooling system of claim 1 wherein the plurality of tubes for providing a flow path for coolant and gases from the evaporator are thin-walled and of a small diameter.

12. The cooling system of claim 1 wherein the heating element is a heater cartridge.

13. The cooling system of claim 1 wherein the heating element comprises a heat sensor in a closed loop system.

14. The cooling system of claim 13 wherein the heating element is also a fluid detector in the closed loop system.

15. A method for cooling a heat-generating device, the method comprising steps of:
    evaporating heated coolant in an evaporator comprising a single chamber for both containing and heating the coolant;
    wherein the single chamber contains both the coolant to be heated and gases produced by heating the coolant;
    wherein the evaporator is disposed in close proximity to a surface of the heat-generating device for releasing gases from the coolant, wherein the gases are used to pump the heated coolant and gases out of the evaporator and into a heat exchanger disposed above the evaporator;
    transferring heated coolant and gases to the heat exchanger in a plurality of tubes;
    cooling the coolant and gases in the heat exchanger;
    collecting the cooled coolant and gases in a reservoir within the heat exchanger;
    activating a heating element for heating the cooled coolant and gases in the reservoir and expanding the gases;
    returning the cooled coolant back to the evaporator using the heated gas to push the fluid down through the plurality of tubes; and
    de-activating the heating element upon receipt of a trigger event, the trigger event comprising an indicator of a status of the coolant in the evaporator.

16. The method of claim 15 wherein the evaporating step comprises pool boiling of the coolant.

17. The method of claim 15 wherein the returning step further comprises returning the chilled coolant through a coolant return tube.

18. The method of claim 17 wherein the returning step further comprises employing a plurality of one-way check valves in the coolant return tube for restricting the flow of coolant to the evaporator.

19. The method of claim 15 wherein the activating step further comprises activating the heating element by an external sensor.

20. The method of claim 15 wherein the activating step further comprises activating the heating element intermittently on a pre-determined time-lapse basis.

* * * * *